United States Patent
Yamaki

(10) Patent No.: US 8,604,474 B2
(45) Date of Patent: Dec. 10, 2013

(54) SEMICONDUCTOR DEVICE INTEGRATED WITH MONITORING DEVICE IN CENTER THEREOF

(75) Inventor: Fumikazu Yamaki, Osaka (JP)

(73) Assignee: Sumitomo Electric Industries Ltd., Osaka (JP)

( * ) Notice: Subject to any disclaimer, the term of this patent is extended or adjusted under 35 U.S.C. 154(b) by 0 days.

(21) Appl. No.: 13/182,536

(22) Filed: Jul. 14, 2011

(65) Prior Publication Data

US 2012/0025188 A1  Feb. 2, 2012

(30) Foreign Application Priority Data

Jul. 27, 2010 (JP) ................................. 2010-168421

(51) Int. Cl.
*H01L 23/58* (2006.01)
*H01L 29/10* (2006.01)

(52) U.S. Cl.
USPC ....................... 257/48; 257/266; 257/E23.179

(58) Field of Classification Search
USPC ........................................ 25/48, 266, E23.179
See application file for complete search history.

(56) References Cited

U.S. PATENT DOCUMENTS

| | | | |
|---|---|---|---|
| 6,593,590 B1 * | 7/2003 | Yang et al. ....................... | 257/48 |
| 7,355,201 B2 * | 4/2008 | Zhu et al. ......................... | 257/48 |
| 7,560,346 B2 * | 7/2009 | Igarashi ......................... | 438/283 |
| 8,278,720 B2 * | 10/2012 | Parkhurst et al. ............. | 257/379 |
| 2004/0164407 A1 * | 8/2004 | Nakajima et al. ............. | 257/724 |

FOREIGN PATENT DOCUMENTS

JP  9-232334  9/1997

* cited by examiner

*Primary Examiner* — William D Coleman
(74) *Attorney, Agent, or Firm* — Smith, Gambrell & Russell, LLP

(57) ABSTRACT

One type of a semiconductor device integrating with a monitoring device is disclosed. The device includes a plurality of gate fingers, two of which arranged in a center of the device has a space wider than a space between any other fingers to suppress the heat concentration on the center of the device. The monitoring region is arranged in this wider space to monitor the temperature dependence of the device.

11 Claims, 4 Drawing Sheets

SEMICONDUCTOR DEVICE INTEGRATED WITH MONITORING DEVICE IN CENTER THEREOF

BACKGROUND OF THE INVENTION

1. Field of the Invention

The present invention related to a semiconductor device integrated with a monitoring device in a center portion thereof to monitor the temperature characteristic of the device, in particular, the invention relates to a semiconductor device made of nitride containing device.

2. Related Prior Art

A Japanese Patent published as JP-H09-232334 has disclosed a field effect transistor (hereafter denoted as FET), where the FET includes gate fingers, source fingers, and drain fingers, where they are arranged in parallel to each other. Individual gate finger is arranged between a source finger and a drain finger. The FET further includes a gate bus bar, a source bus bar, and a drain bus bar. Respective bus bars electrically collect corresponding fingers.

An FET often is required to compensate temperature performance thereof, and installs a temperature sensor therein. The bias supplied to the FET may be adjusted in accordance with a temperature detected by the temperature sensor. However, it is extraordinary to integrate such temperature sensor within a discrete device such as single FET because the temperature sensor probably enlarges the chip size of the FET device.

SUMMARY OF THE INVENTION

An aspect of the present invention relates to a semiconductor device integrating with a temperature sensor. The semiconductor device according to the invention comprises a semiconductor body, a gate fingers and a gate bus bar electrically collecting the gate fingers, a source fingers and a source bus bar electrically collecting the source fingers, a drain fingers and a drain bus bar electrically collecting the drain fingers, and a monitoring region. A feature of the semiconductor device of the invention is that two of gate fingers disposed in a center of the body and adjacent to each other are apart by a space wider than a space between other gate fingers, and the monitoring region is disposed in one of the source bus bar and the drain bus bar between the two of gate fingers.

The semiconductor body may include a first region and a second region. The first region is electrically active and disposes the gate fingers, the source fingers, and the drain fingers thereon. The second region surrounds the first region and disposes the drain bus bar, the gate bus bar, and the source bus thereon. The drain bus bar is arranged in one portion of the second region; while, the gate bus bar and the source bas bar are arranged in another portion of the second region which puts the first region therebetween. In the present invention, the monitoring region may be arranged in the second region between the two gate fingers.

BRIEF DESCRIPTION OF THE DRAWINGS

The foregoing and other purposes, aspects and advantages will be better understood from the following detailed description of a preferred embodiment of the invention with reference to the drawings, in which.

DETAILED DESCRIPTION OF PREFERRED EMBODIMENTS

Next, some preferred embodiments according to the present invention will be described as referring to accompanying drawings. In the description of the drawings, the same numerals or symbols will refer to the same elements without overlapping explanation.

First Embodiment

Figure 1:
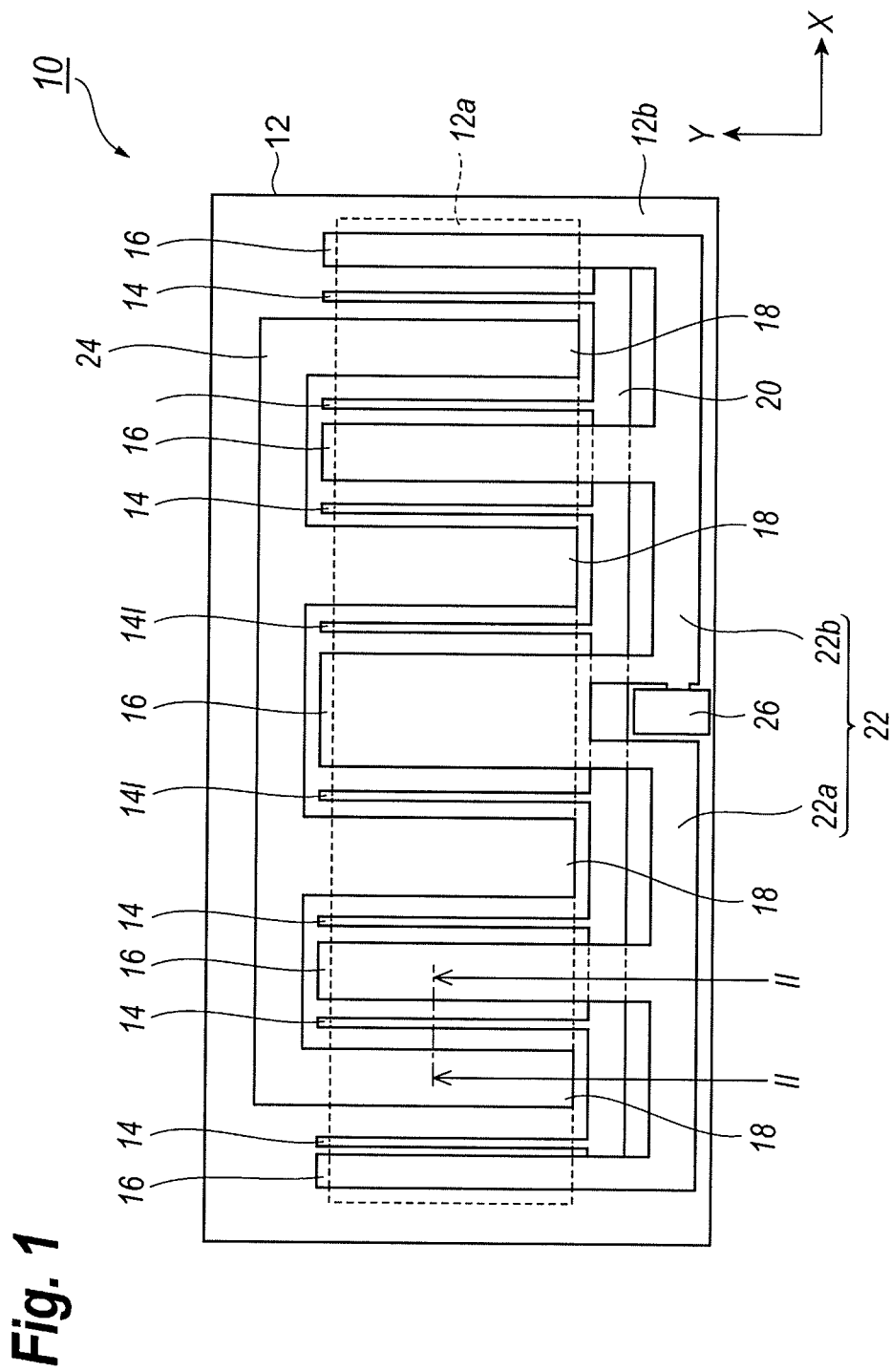
FIG. 1 is a plan view of a semiconductor device according to the first embodiment of the invention.

FIG. 1 is a plan view of a semiconductor device according to the first embodiment of the present invention. The semiconductor device 10 shown in FIG. 1 includes a semiconductor body 12, a plurality of gate fingers, 14 and 141, a plurality of source fingers 16, a plurality of drain fingers 18, a gate bus bar 20, a source bus bar 22, a drain bus bar 24, and a monitoring region 26. The semiconductor device 10 includes a first region 12a and a second region 12b. The former region 12a constitutes the Field Effect Transistor (FET) accompanied with the gate fingers, 14 and 141, the source fingers 16, the drain fingers 18, the gate bus bar 20, the source bus bar 22, and the drain bus bar 24.

Figure 2:
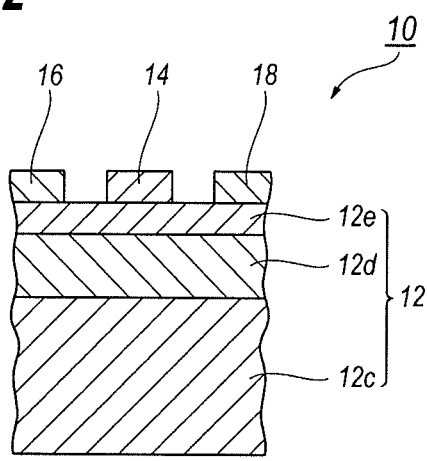
FIG. 2 is a cross section taken along the line II-II indicated in FIG. 1.

The first region of the semiconductor body 12 extends along the X-direction, while, the second region 12b surrounds the first region 12a. In the present embodiment shown in FIG. 1, the second region 12b puts the first region 12a therebetween along the Y-direction. FIG. 2 is a cross section taken along the line II-II indicated in FIG. 1. The semiconductor body 12 includes a semiconductor substrate 12c, a first layer 12d, and a second layer 12e. Although the specification concentrates on an arrangement where the semiconductor substrate 12c is made of silicon carbide (SiC), the substrate 12c may be made of gallium nitride (GaN), silicon (Si) and so on. The first layer 12d may be made of GaN epitaxially grown on the semiconductor substrate 12c. The second layer 12e may be made of aluminum-gallium-nitride (AlGaN) also epitaxially grown on the GaN layer 12d.

Referring back to FIG. 1, the first region 12a operates as an active region of the FET, while, the second region 12b is electrically inactive except for the monitoring region 26. The gate fingers, 14 and 141, the source fingers 16, and the drain fingers 18 each extends along the Y-direction in the first region 12a. That is, these fingers, 14 to 18, are arranged substantially in parallel to the others. Individual gate finger, 14 and 14I, is arranged between one of the source fingers 16 and one of the drain fingers 18.

The gate bus bar 20 extends along the X-direction in the second region 12b. Specifically, the gate bus bar 20 is arranged in a portion of the second region 12b adjacent to the first region 12. The gate bus bar 20 electrically collects respective gate fingers 14. The drain bus bar 24 extends along the X-direction in the second region 12b. Specifically, the drain bus bar 24 is arranged in another second region 12b opposite to the region 12b where the gate bus bar 20 is arranged. The drain bus bar 24 electrically collects the drain fingers 18.

The source bus bar 22 also extends along the X-direction in the second region 12b. Specifically, the source bus bar 22 is arranged in one of second region 12b where the gate bus bar 20 is arranged but in a side apart from the first regions 12a. That is, the source bus bar 22 and the first region 12a put the gate bus bar 20 therebetween in the second region 12b.

As illustrated in FIG. 1, the source bus bar 22 includes first and second regions, 22a and 22b, respectively. Two regions, 22a and 22b, are arranged in side by side along the X-direction with a space therebetween. An area between two regions, 22a and 22b, and in the second region 12b of the semiconductor arranges the monitoring region 26.

Figure 3:
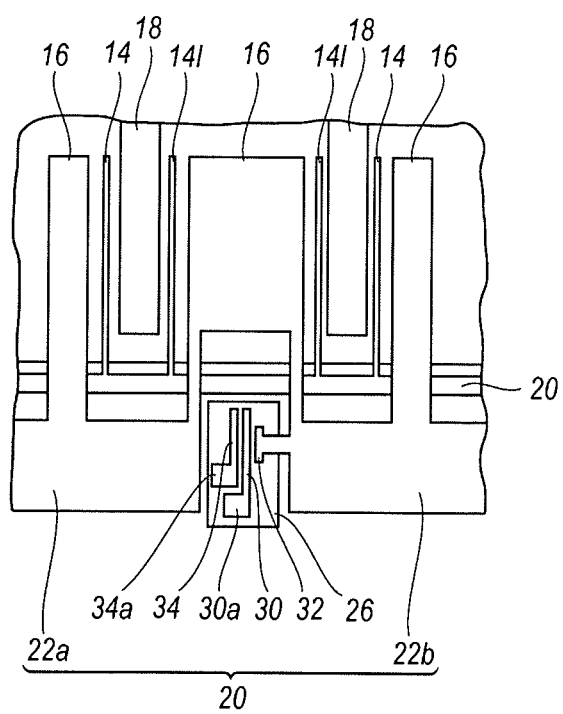
FIG. 3 magnifies a portion of the semiconductor device including the monitoring region.

FIG. 3 is a plan view that magnifies an area including the monitoring region 26. The monitoring region 26 arranges the gate electrode 30, the source electrode 32, and the drain electrode 34 therein. These electrodes, 30 to 34, extend along the X-direction. The body 12 in the monitoring region and these electrodes, 30 to 34, constitute an FET for monitoring the performance of the device 10.

The gate electrode 30 accompanies with a gate pad 30a and the drain electrode 34 accompanies with a drain pad 34a. These pads, 30a and 34a, are formed in outer side of the body 12 with respect to respective electrodes, 30 and 34. The source electrode 32 is connected to the source bus bar 22, that is, the source bus bar 22 may provide a function of the source pad.

The FET formed in the monitoring region 26 may contribute to the temperature compensation of the device 10. Specifically, the FET formed therein is fixedly biased under preset and constant drain current. Monitoring the drain voltage, the temperature dependence of the device 10 may be obtained. When the drain output is fed back to the operation of the device, the temperature dependence of the FET performance may be automatically compensated.

The device 10 has a feature in the arrangement of the gate fingers, that is, two gate fingers 141 arranged in a center portion of the device 10 set a space therebetween wider than a space between other gate fingers 14. This arrangement may effectively suppress the heat concentration on the center portion of the device 10. Thus, the device 10 may show a relatively homogeneous thermal distribution.

Because of an expanded space between the gate fingers 141, the second region 12b in this expanded space may provide a room to form additional device. Thus, the device 10 may prepare the monitoring region 26 in the second region 12b but adjacent to the first region 12a within this expanded space, which is effective to prevent the expansion of the device size.

Moreover, the device 10 of the present embodiment connects the source bus bar 22 to the source electrode 32 of the monitoring FET, which makes it possible not only to omit the source electrode for the monitoring FET but to shorten the interconnection between the source electrode 32 and the source bus bar 22.

Second Embodiment

Figure 4:
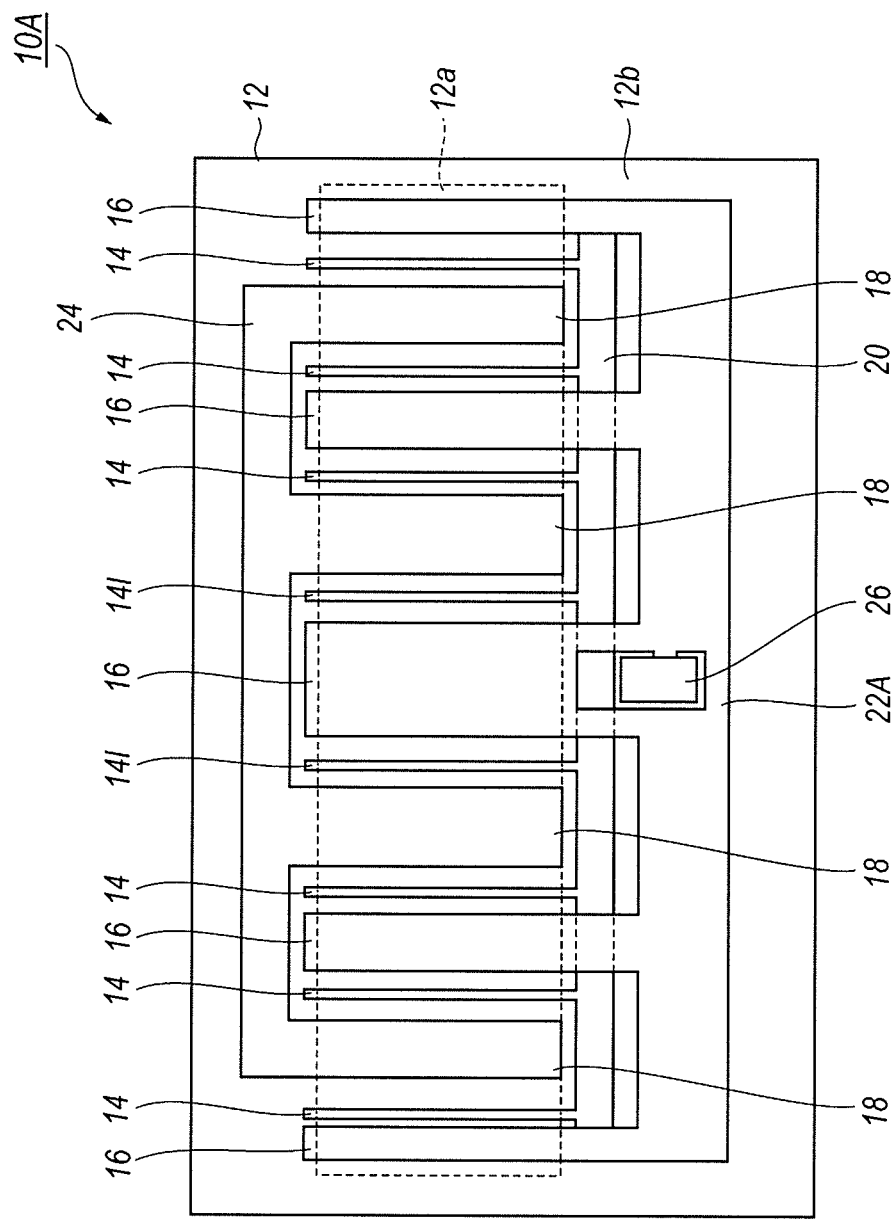
FIG. 4 is a plan view of another semiconductor device according to the second embodiment of the invention.

FIG. 4 is a plan view showing a layout of another semiconductor device 10A according to the second embodiment of the invention. The source bus bar 22 of the former embodiment is divided into two parts, 22a and 22b, between which the monitoring region is arranged. While, the source bus bar 22A of the present embodiment arranges the monitoring region 26 within a primary portion of the source bus bar 22A with a gap therebetween. That is, the source bus bar 22A is arranged so as to bypass the monitoring region 26.

Third Embodiment

Figure 5:
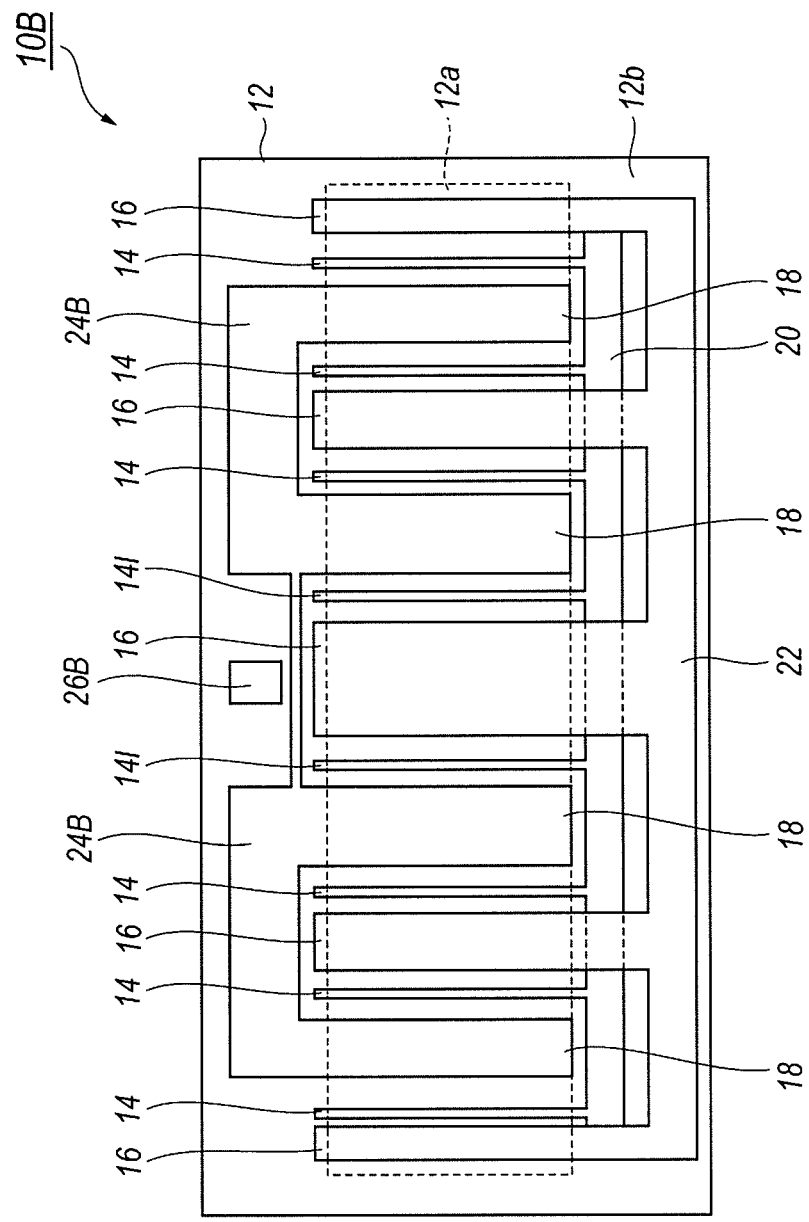
FIG. 5 is a plan view of still another semiconductor device according to the third embodiment of the invention.

FIG. 5 is a plan view of still another semiconductor device 10B according to the third embodiment of the invention. The semiconductor device 10B arranges the monitoring region 26B in the portion of the second region 12b where the drain bus bar 24 is formed. Specifically, the device 10B separates the drain bus bar 24B into two sections, between which the monitoring region 26B is arranged adjacent to the first region 12a of the body 12. The monitoring region 26B of the present embodiment prepares the drain pad for the drain electrode 34 therein but which is electrically isolated from the drain bus bar 24B. While, two drain bus bars 24B are electrically connected with an interconnection arranged so as to bypass the monitoring region 26B. Thus, even the drain bus bar 24B takes the monitoring region 26B therein; the drain bus bar 24B holds a function of the single bus bar.

In the foregoing detailed description, the device of the present invention have been described with reference to specific exemplary embodiments thereof. It will, however, be evident that various modifications and changes may be made thereto without departing from the broader spirit and scope of the present invention. For instance, the specification concentrates on the devices, 10 to 10B, made of nitride based material, such as GaN, AlGaN, and so on. However, the subject of the present invention may be applicable to those made of gallium arsenide (GaAs) related material such as GaAs or the substrate 12c, Si-doped n-type GaAs for the first layer, and n-type AlGaAs for the second layer 12e. Moreover, the device may include a plural gate bus bar, a plural source bas bar, and a plural drain bus bar each coupled with at least one corresponding electrode. Thus, the present specification and figures are accordingly to be regarded as illustrative rather than restrictive.

What is claimed is:

1. A semiconductor device comprising:
   a semiconductor body including a first region and a second region surrounding the first region, the first region being electrically active;
   gate fingers disposed in the first region and a gate bus bar disposed in the second region, the gate bus bar electrically collecting the gate fingers, two adjacent gate fingers being disposed in a center of the semiconductor body and spaced from each other by a space wider than a space between other adjacent gate fingers;
   source fingers disposed in the first region and a source bus bar disposed in the second region, the source bus bar electrically collecting the source fingers;
   drain fingers disposed in the first region and a drain bus bar disposed in one portion of the second region putting the gate bus bar and the source bus bar therebetween, the drain bus bar electrically collecting the drain fingers; and
   a monitoring region disposed in the source bus bar between the two adjacent gate fingers in the center of the semiconductor body, and surrounded by the source bus bar.

2. The semiconductor device of claim 1,
   wherein the source bus bar includes a first bus bar and a second bus bar electrically connected to the first bus bar, and
   wherein the monitoring region also is disposed between the first bus bar and the second bus bar.

3. A semiconductor device comprising:
   a semiconductor body including a first region and a second region surrounding the first region, the first region being electrically active;
   gate fingers disposed in the first region and a gate bus bar disposed in the second region, the gate bus bar electrically collecting the gate fingers, two adjacent gate fingers being disposed in a center of the semiconductor body and spaced from each other by a space wider than a space between other adjacent gate fingers;

source fingers disposed in the first region and a source bus bar disposed in the second region, the source bus bar electrically collecting the source fingers;

drain fingers disposed in the first region and a drain bus bar disposed in the second region, the drain bus bar electrically collecting the drain fingers and being arranged in one portion of the second region putting the gate bus bar and the source bus bar therebetween; and a monitoring region, wherein the gate bus bar includes a first bus bar and a second bus bar electrically connected to the first bus bar, and wherein the monitoring region is disposed between the first bus bar and the second bus bar.

4. A semiconductor device, comprising:

a semiconductor body including an independent transistor;

gate fingers and a gate bus bar electrically collecting the gate fingers;

source fingers and a source bus bar electrically collecting the source fingers;

drain fingers and a drain bus bar electrically collecting the drain fingers; and a monitoring region to monitor performance of the independent transistor, wherein the gate bus bar, the source bus bar, and the drain bus bar are arranged in an electrically inactive region of the semiconductor body and the monitoring region is surrounded by the electrically inactive region.

5. The semiconductor device of claim 4, wherein the gate fingers, the source fingers, and the drain fingers are arranged in an electrically active region of the semiconductor body surrounded by the electrically inactive region, and wherein the drain bus bar is arranged in a portion of the electrically inactive region putting the gate bus bar and the source bus bar therebetween.

6. The semiconductor device of claim 4, wherein the body includes a semiconductor substrate made of GaN, a first layer made of GaN, and a second layer made of AlGaN.

7. The semiconductor device of claim 5, wherein the monitoring region is disposed within the source bus bar.

8. The semiconductor device of claim 5, wherein the monitoring region includes a gate electrode, a drain electrode, and a source electrode, the gate electrode, the drain electrode and the source electrode constituting a FET, and wherein the source electrode is connected to the source bus bar.

9. The semiconductor device of claim 5, wherein the gate bus bar includes a first bus bar and a second bus bar, and wherein the monitoring region is between the first bus bar and the second bus bar.

10. The semiconductor device of claim 7, wherein the source bus bar includes a first bus bar and a second bus bar electrically connected to the first bus bar, and wherein the monitoring region is disposed between the first bus bar and the second bus bar.

11. The semiconductor device of claim 8, wherein the FET is fixedly biased with a preset drain current flowing between the drain electrode and the source electrode.

* * * * *